United States Patent [19]

Duffalo et al.

[11] Patent Number: 4,980,656
[45] Date of Patent: Dec. 25, 1990

[54] ACTIVE INPUT IMPEDANCE TUNER FOR COMPENSATING FOR POWER LOSS

[75] Inventors: Joseph M. Duffalo, Mesa; Rimantas L. Vaitkus, Paradise Valley, both of Ariz.

[73] Assignee: Motorola, Inc., Schaumburg, Ill.

[21] Appl. No.: 444,225

[22] Filed: Dec. 1, 1989

[51] Int. Cl.$^5$ ........................................... H03H 11/02
[52] U.S. Cl. ........................... 333/17.1; 330/86; 455/125
[58] Field of Search ............... 333/17.1, 17.3, 109; 330/279, 291, 75, 86, 282; 455/125, 123, 126

[56] References Cited

U.S. PATENT DOCUMENTS

| 3,311,827 | 3/1967 | Greefkes et al. | 455/126 X |
| 3,906,411 | 9/1975 | Lind et al. | 333/17.1 X |
| 4,019,150 | 4/1977 | Lurey et al. | 455/126 X |

Primary Examiner—Paul Gensler
Attorney, Agent, or Firm—Michael D. Bingham; Robert D. Atkins

[57] ABSTRACT

A tuning circuit is provided for increasing the power transfer between first and second electrically coupled utilization circuits while controlling the effective source reflection coefficient thereby increasing the power available to the latter wherein the input signal provided at the output of the first utilization circuit is reflected back reducing the power available at the input of the second utilization circuit. The input signal is applied to the first input of the power combiner while a feedback signal proportional to the power loss between the first and second utilization circuits is applied to the second input of the power combiner. The output of the power combiner is increased by the feedback signal for compensating the power loss of the input signal such that the power available to the second utilization circuit is increased.

17 Claims, 2 Drawing Sheets

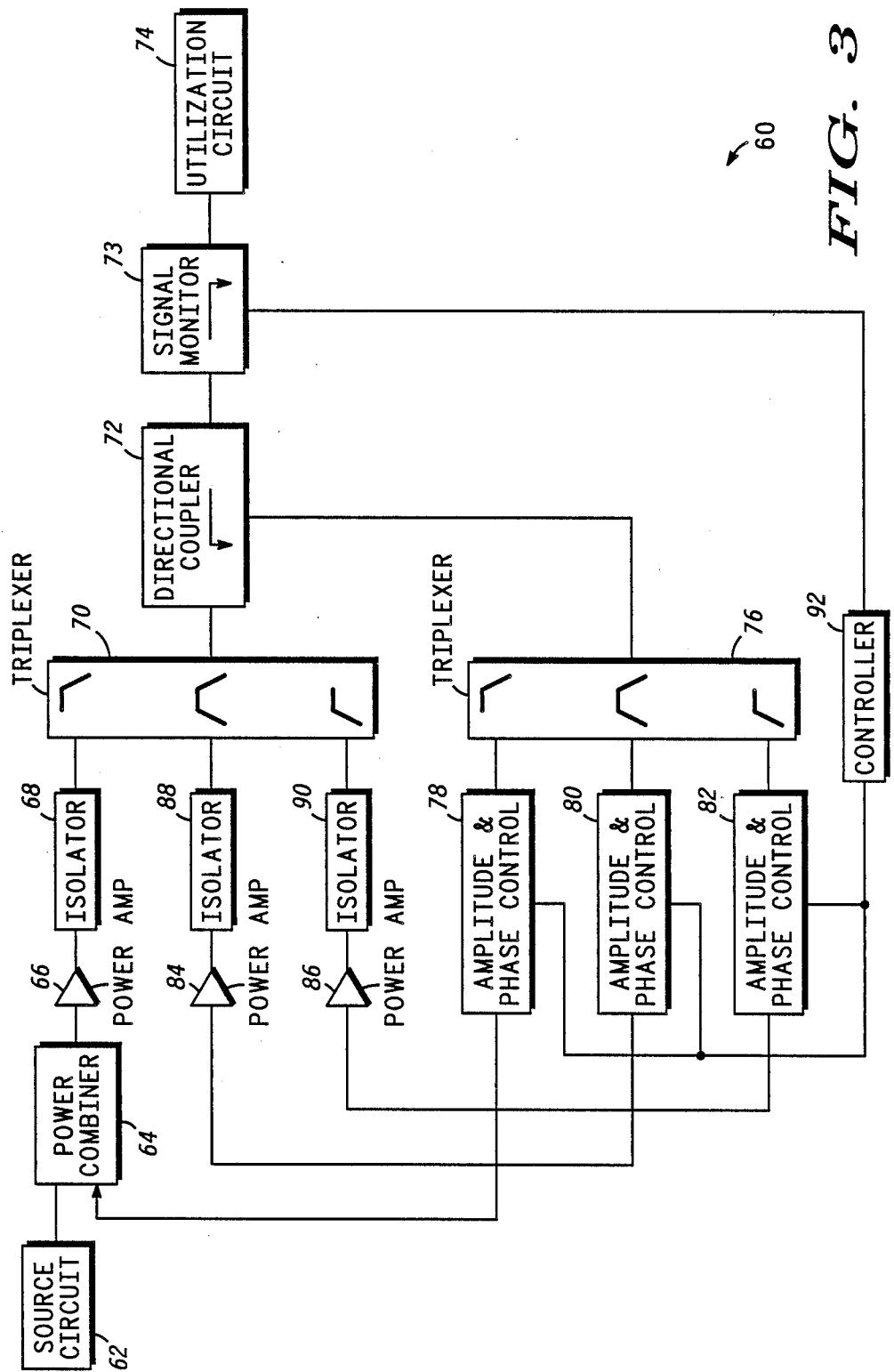

ACTIVE INPUT IMPEDANCE TUNER FOR COMPENSATING FOR POWER LOSS

BACKGROUND OF THE INVENTION

The present invention relates in general to tuning circuits, and more particularly, to an active impedance tuning circuit for compensating the loss of power between electrically mismatched source and utilization circuits whereby the power available to the latter is increased.

A common problem occurring between electrically mismatched source and utilization circuits is the loss of power due to the reflection of the input signal incident to the junction of the source and utilization circuits. The reflected signal may include multiple harmonics of the incident signal as well as the fundamental frequency shifted in phase depending upon the nonlinearity across the junction, causing the reflected wave to interfere with the forward propagating input signal thereby developing a power loss in the forward transmission path limiting the power available to the utilization circuit. This is true especially for input signals operating at high frequencies, i.e., in the ratio frequency (RF) band or higher. The reflected waveform, and correspondingly the power loss, may be reduced by matching (equating) the impedances of the source and utilization circuits observed on both sides of the junction. Conventional impedance matching techniques include the use of passive components serially coupled in the forward transmission path selected such that the source and utilization impedances are matched at the fundamental frequency. However, the impedance of the passive components in the forward transmission path also dissipates power again reducing the power transfer even for a matched condition. In addition, passive components such as fixed inductors and capacitors and stub tuners are frequency dependent devices and therefore provide satisfactory impedance matching only over a limited bandwidth.

In broad band applications, impedance matching may also be required at certain harmonic frequencies of the fundamental, typically the second and third harmonics, to achieve maximum power transfer. Computer controlled impedance tuners are available for tuning over the broad band, but typically are adjusted at the fundamental frequency and do not provide independent tuning of the reflected harmonic components. High efficiency amplifiers are also known for increasing the power available to the load; however, such devices usually require custom design and fabrication for each specific application and become increasingly difficult to use at higher frequencies.

Hence, there is a need for an active impedance tuning circuit for increasing the power available to the latter of electrically coupled, possibly mismatched source and utilization circuits, independent of the operating frequency.

SUMMARY OF THE INVENTION

Accordingly, it is an objective of the present invention to provide an improved impedance tuning circuit.

A further objective of the present invention is to provide an improved impedance tuning circuit for providing compensation of the power loss in the forward transmission path between electrically mismatched circuits such that the power available to the load is increased.

Another objective of the present invention is to provide an improved impedance tuning circuit for increasing the power available to the load independent of operating frequency.

Yet another objective of the present invention is to provide an improved impedance tuning circuit for providing independent compensation of the power losses attributed to the harmonics of the reflected signal resulting from a nonlinear impedance mismatch at the junction of electrically coupled circuits.

In accordance with the above and other objectives there is provided an improved tuning circuit coupled between first and second utilization circuits for increasing the power transfer therebetween. A power combiner provides an output signal as the sum of the signal power applied to the first and second inputs thereof. The first input is coupled to the first utilization circuit, while the output of the power combiner is coupled to the input of a directional coupler having a first output coupled to the input of the second utilization circuit and a second output for diverting the signal power reflected from the second utilization circuit. An amplitude and phase control circuit is coupled between the second output of the directional coupler and the second input of the power combiner and responsive to a control signal applied at a control input for controlling the transfer function thereof such that the signal power applied at the second input of the power combiner in combination with the signal power provided by the first utilization circuit increases the power at the output of the first circuit and compensates for power loss between the first and second utilization circuits.

BRIEF DESCRIPTION OF THE DRAWINGS

FIG. 3 is a simplified block diagram illustrating an alternate embodiment of the present invention.

DETAILED DESCRIPTION OF THE PREFERRED EMBODIMENT

Figure 1:
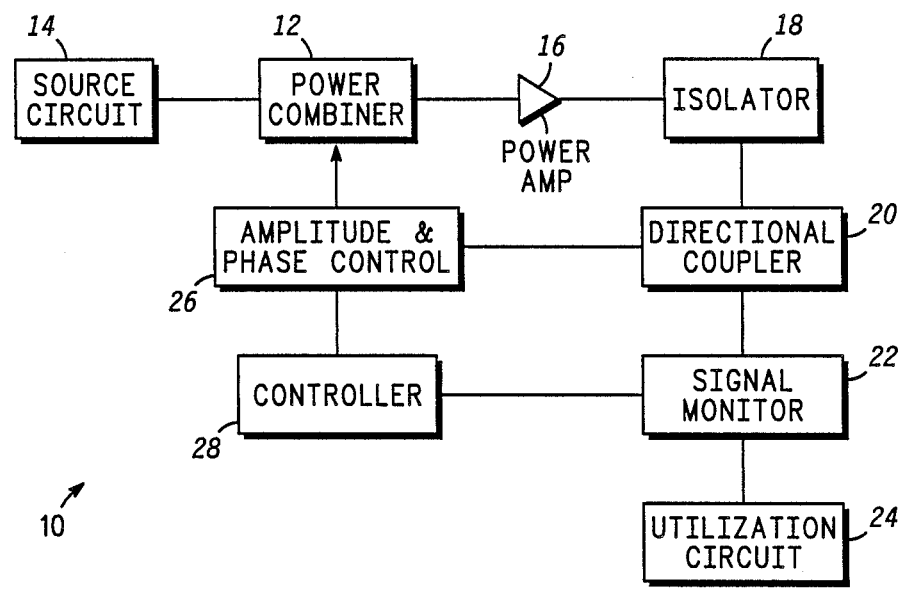
FIG. 1 is a simplified block diagram illustrating the preferred embodiment of the present invention.

Referring to FIG. 1, impedance tuning circuit 10 is shown including power combiner 12 having a first input coupled to the output of source circuit 14, the latter of which provides a monotone input signal, typically high frequency in the RF band or above. The output of power combiner 12 is coupled through power amplifier 16 to the input of isolator 18, while the output of isolator 18 is coupled to the input of directional coupler 20. The first output of directional coupler 20 is coupled through signal monitor circuit 22 to utilization circuit 24, and the second output of the same is coupled through amplitude and phase control circuit 26 to the second input of power combiner 12. Signal monitor circuit 22 also includes a second output coupled to the input of control circuit 28 for providing control signals at the control input of amplitude and phase control circuit 26.

The input signal provided at the output of source circuit 14 is typically a monotone RF waveform having a particular amplitude and phase. The signal power applied at the first and second inputs of power combiner 12 is summed, amplified through power amplifier 16 and transmitted through isolator 18 and direction coupler 20 and signal monitor circuit 22 to the input of utilization circuit 24. The input impedance of utilization circuit 24, $Z_{util}$, may not match the effective impedance looking back toward source circuit 14, $Z_{source}$, in which case a portion of the incident signal is reflected back as determined by the reflection coefficient, $\Gamma_\nu$, of the respective impedances. The reflection coefficient is defined in equation (1) in terms of impedances $Z_{util}$ and $Z_{source}$ as follows:

$$\Gamma_\nu = \frac{Z_{util} - Z_{source}}{Z_{util} + Z_{source}} \quad (1)$$

The reflected signal typically includes the fundamental frequency of the incident signal, although often shifted in phase, and one or more harmonics depending upon the nonlinearity of the junction impedance wherein the junction is defined at the input of utilization circuit 24. The frequency and phase characteristics of the reflected signal tends to interfere with the input signal propagating through the forward transmission path, i.e., through isolator 18 and directional coupler 20 and signal monitor circuit 22, reducing the power available to utilization circuit 24. It is desirable to minimize the reflected signal for increasing the power available to utilization circuit 24, and additionally to compensate for the power loss in the forward transmission path by boosting the signal power of the input signal to overcome the power loss. Toward this end, directional coupler 20 is provided for coupling the reflected signal to the input of amplitude and phase control circuit 26, the latter of which is also responsive to the control signals provided at the output of control circuit 28 for controlling the transfer function thereof to develop a feedback signal which when applied to the second input of power combiner 12 compensates for the power loss thereby increasing the power transfer in the forward transmission path. The signal provided at the second output of signal monitor circuit 22 is proportional to the power incident to utilization circuit 24. Signal monitor circuit 22 may for example be realized as a directional coupler oriented for sampling the forward propagating signal power thereby measuring the incident power to utilization circuit 24. Hence, control circuit 28 is responsive to the input signal of utilization circuit 24 for providing the control signals to adjust the transfer function of amplitude and phase control circuit 26 whereby the signal power of the feedback signal applied to the second input of power combiner 12 combines with the signal power of the input signal for boosting the output power of power combiner 12 and increasing the input power of utilization circuit 24. It is understood that amplitude and phase control circuit 26 additionally controls the effective source reflection coefficient at the input of utilization circuit 24 for increasing the power transfer efficiency and stability. In addition, isolator 18 is provided to shunt to ground any component of the reflected signal appearing at the input of directional coupler 20 thereby shielding or buffering the output of power amplifier 16.

Figure 2:
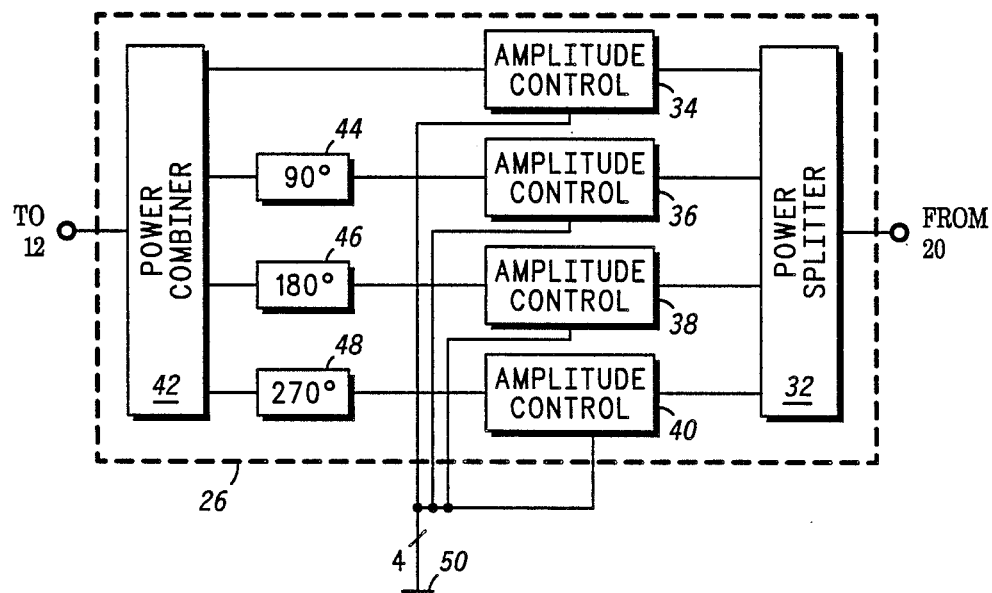
FIG. 2 is a simplified block diagram providing additional detail of one aspect of the invention.

Turning to FIG. 2, amplitude and phase control circuit 26 is illustrated comprising power splitter 32 having an input coupled for receiving the reflected signal provided at the second output of directional coupler 20 and having first, second, third and fourth outputs coupled through amplitude control circuits 34, 36, 38 and 40, respectively, to the first, second, third and fourth inputs of power combiner 42. In addition, phase shift circuits 44, 46 and 48 are coupled between amplitude control circuits 36, 38 and 40 and the second, third and fourth inputs of power combiner 42, respectively, wherein phase shift circuits 44, 46 and 48 provide 90°, 180° and 270° of phase shift for the signal propagating therethrough, while the output of power combiner 42 is coupled to the second input of power combiner 12. Amplitude control circuits 34, 36, 38 and 40 are responsive to the first, second, third and fourth control signals of control circuit 28, respectively, provided at input 50.

The power of the reflected signal is balanced between the first, second, third and fourth outputs of power splitter 32, hence, one quarter of the total power of the reflected signal passes through each of the amplitude control circuits 34–40 and phase shift circuits 44–48 (for the latter three) to the first, second, third and fourth inputs of power combiner 42. The control signals applied at input 50 control the transfer function of amplitude and phase control circuit 26 for providing a particular combination of amplitude and phase at the output of power combiner 42. For example, if a 90° phase shift across amplitude and phase control circuit 26 is needed, then the control signals may adjust amplitude control circuits 34, 38 and 40 such that the signals passing therethrough are substantially decreased, while governing amplitude control circuit 36 to amplify its signal thereby providing the desired amplitude and phase of the feedback signal at the second input of power combiner 12. Likewise, the proper combination of signals flowing through phase shift circuits 44 (90°) and 46 (180°) may yield a 120° phase shift across amplitude and phase control circuit 26; other combinations may be realized in a like manner. Control circuit 28 may include a peak power monitor circuit under control of a microprocessor, for example, to detect the power incident to utilization circuit 24 and adjust the values of amplitude control circuits 34–40 for providing maximum power transfer. Hence, controlling the transfer function of amplitude and phase control circuit 26 provides the appropriate magnitude and phase of the feedback signal wherein the combination of the feedback signal and input signal boosts the total power at the output of power combiner 12 and compensates for the loss in the forward transmission path thereby increasing the power available to utilization circuit 24 and controlling the effective source reflection coefficient at the input thereof. It should be appreciated that since amplitude and phase control circuit 26 is controlled to yield maximum power at the input of utilization circuit 24, the frequency of operation does not influence the power available to the latter.

The present invention may be expanded, as illustrated in FIG. 3, for providing power compensation for the multiple harmonics of the fundamental frequency. Impedance tuner 60 comprises source circuit 62 for supplying a monotone input signal to the first input of power combiner 64. The output of power combiner 64 is coupled to the input of power amplifier 66, the output of which is coupled through isolator 68 to the first input of triplexer 70. The output of triplexer 70 is coupled through directional coupler 72 and signal monitor circuit 73 for providing the incident signal to utilization circuit 74, while the reflected signal is routed through directional coupler 72 to the input of triplexer 76. The first output of triplexer 76 is coupled through amplitude and phase control circuit 78 to the second input of power combiner 64, and the second and third outputs of triplexer 76 are coupled through amplitude and phase control circuits 80 and 82 to the inputs of power amplifiers 84 and 86, respectively. The outputs of power amplifiers 84 and 86 are then coupled through isolators 88 and 90 to the second and third inputs of triplexer 70. The second output of signal monitor circuit 73 is coupled to the input of control circuit 92 for monitoring the input power of utilization circuit 74 and providing control signals to the control inputs of amplitude and phase control circuits 78, 80 and 82.

The operation of impedance tuner 60 closely parallels the previous discussion of impedance tuning circuit 10, wherein the signal power applied to the first and second inputs of power combiner 64 is combined, amplified through power amplifier 66 and propagated through isolator 68 to the first input of triplexer 70. The low pass filter of the first input passes the fundamental frequency through directional coupler 72 and signal monitor circuit 73 to the input of utilization circuit 74. If the input impedance of utilization circuit 74, $Z_{util}$, does not match the effective impedance looking back toward source circuit 62, $Z_{source}$, then a portion of the incident signal is reflected back through direction coupler 72 to the input of triplexer 76. Due to the nonlinearity at the input of utilization circuit 74, the reflected signal typically includes multiple harmonics of the fundamental frequency. The reflected signal is filtered, i.e., low pass, bandpass and high pass, through triplexer 76 such that the fundamental component of the reflected signal and predetermined harmonics thereof, typically second and third, are provided at first, second and third outputs of triplexer 76, respectively. The predetermined harmonic components of the reflected signal are attenuated (or amplified) and phase shifted in amplitude and phase control circuits 80 and 82 under direction of control circuit 92 and amplified through power amplifier 84 and 86 and transmitted through isolators 88 and 90 to the second and third inputs of triplexer 70. Again, isolators 68, 88 and 90 protect the respective power amplifiers from the adverse effects of the reflected signal. Concurrently, the fundamental component of the reflected signal is summed with the power of the input signal through power combiner 64, amplified and combined with the power of the harmonic components through triplexer 70. Hence, control circuit 92 selects the transfer function of amplitude and phase control circuits 78–82 for providing the appropriate amplitude and phase of the feedback signals which when combined with the input signal provide a composite power signal at the output of triplexer 70 through directional coupler 72 and signal monitor circuit 73 to the input of utilization circuit 74 whereby the incident power is increased.

Hence, what has been provided is a novel impedance tuning circuit wherein the transfer function of the feedback path is controlled such that the signal power of the feedback signal boosts the input signal power and compensates the loss of power in the forward transmission path while controlling the effective source reflection coefficient between source and utilization circuits thereby increasing the power available to the latter.

We claim:

1. A tuning circuit coupled between first and second utilization circuits, comprising:
    first means having first and second inputs for combining signal power applied thereto and having an output, said first input being coupled to the first utilization circuit;
    second means coupled between said output of said first means and the input of the second utilization circuit and having an output for diverting the signal power reflected from the second utilization circuit; and
    third means having a controllable transfer function responsive to a control signal applied at a control input, said third means also being responsive to said reflected signal power provided at said output of said second means for providing the signal power to said second input of said first means which combines with the signal power provided by the first utilization circuit to increase the power at said output of said first means and compensate for power loss between the first and second utilization circuits.

2. The tuning circuit of claim 1 further comprising fourth means responsive to the signal at the input of the second utilization circuit for providing said control signal for controlling the transfer function of said third means.

3. The tuning circuit of claim 2 further comprising:
    amplifying means having an input coupled to said output of said first means for amplifying the signal power propagating therethrough and having an output; and
    isolating means coupled between said output of said amplifying means and said second means for blocking the reflected signal.

4. A tuning circuit coupled between first and second utilization circuits, comprising:
    first means having first and second inputs for combining signal power applied thereto respectively and having an output, said first input being coupled to the first utilization circuit, wherein said first means includes a first power combiner for providing an output signal having signal power equal to the sum of the signal power applied at said first and second inputs thereof;
    second means coupled between said output of said first means and the input of the second utilization circuit and having an output for providing signal power reflected from the second utilization circuit;
    third means having a controllable transfer function responsive to a control signal applied at a control input, said third means also being responsive to said reflected signal power provided at said output of said second means for providing the signal power to said second input of said first means which combines with the signal power provided by the first utilization circuit to increase the power at said output of said first means and compensate for power loss between the first and second utilization circuits;
    fourth means responsive to the signal at the input of the second utilization circuit for providing said control signal for controlling the transfer function of said third means;
    amplifying means having an input coupled to said output of said first means for amplifying the signal power propagating therethrough and having an output; and
    isolating means coupled between said output of said amplifying means and said second means for blocking the reflected signal.

5. The tuning circuit of claim 4 wherein said second means includes a directional coupler having a first output for passing signal power through to the input of the second utilization circuit and having a second output for routing said reflected signal power to said third means.

6. The tuning circuit of claim 5 wherein said third means includes:
   a power splitter having an input coupled to said output of said directional coupler and having a plurality of outputs;
   a second power combiner having a plurality of inputs respectively coupled to said plurality of outputs of said power splitter and having an output coupled to said second input of said first power combiner; and
   a plurality of amplitude/phase control circuits respectively coupled between said plurality of outputs of said power splitter and said plurality of inputs of said second power combiner.

7. The tuning circuit of claim 6 wherein said control signal includes a plurality of control signals.

8. The tuning circuit of claim 7 wherein said plurality of amplitude/phase control circuits includes:
   a first amplitude control circuit coupled between a first one of said plurality of outputs of said power splitter and a first one of said plurality of inputs of said second power combiner and responsive to a first one of said plurality of control signals;
   a first phase shift circuit coupled between said first one of said plurality of outputs of said power splitter and said first one of said plurality of inputs of said second power combiner;
   a second amplitude control circuit coupled between a second one of said plurality of outputs of said power splitter and a second one of said plurality of inputs of said second power combiner and responsive to a second one of said plurality of control signals;
   a second phase shift circuit coupled between said second one of said plurality of outputs of said power splitter and said second one of said plurality of inputs of said second power combiner;
   a third amplitude control circuit coupled between a third one of said plurality of outputs of said power splitter and a third one of said plurality of inputs of said second power combiner and responsive to a third one of said plurality of control signals;
   a third phase shift circuit coupled between said third one of said plurality of outputs of said power splitter and said third one of said plurality of inputs of said second power combiner;
   a fourth amplitude control circuit coupled between a fourth one of said plurality of outputs of said power splitter and a fourth one of said plurality of inputs of said second power combiner and responsive to a fourth one of said plurality of control signals; and
   a fourth phase shift circuit coupled between said fourth one of said plurality of outputs of said power splitter and said fourth one of said plurality of inputs of said second power combiner.

9. The tuning circuit of claim 8 wherein said fourth means includes:
   a signal monitor circuit having a first output coupled to the input of the second utilization circuit and having a second output; and
   a control circuit coupled between said second output of said second directional coupler and said control input of said third means.

10. A tuning circuit coupled between first and second electrically mismatched utilization circuits for increasing the power transfer therebetween, comprising:
   a first power combiner having first and second inputs and having an output, said first input is coupled to the output of the first utilization circuit;
   a power amplifier having an input coupled to said output of said first power combiner for providing an amplified output signal and having an output;
   a isolator circuit having an input coupled to said output of said power amplifier for providing unidirectional power flow and having an output;
   a directional coupler having an input coupled to said output of said isolator circuit and having first and second outputs, said first output is coupled to the second utilization circuit; and
   a feedback circuit coupled between said second output of said directional coupler and said second input of said first power combiner and having a control input at which a control signal is applied for controlling the transfer function thereof.

11. The tuning circuit of claim 10 further comprising:
   a signal monitor circuit having an input coupled to said first output of said directional coupler and having first and second outputs wherein said first output is coupled to the input of the second utilization circuit; and
   a control circuit coupled between a second output of said second directional coupler and said control input of said feedback circuit.

12. A tuning circuit coupled between first and second electrically mismatched circuits for increasing the power transfer therebetween, comprising:
   a first power combiner having first and second inputs and having an output, said first input is coupled to the output of the first utilization circuit;
   a power amplifier having an input coupled to said output of said first power combiner for providing an amplified output signal and having an output;
   a isolator circuit having an input coupled to said output of said power amplifier for providing unidirectional power flow and having an output;
   a directional coupler having an input coupled to said output of said isolator circuit and having first and second outputs, said first output is coupled to the second utilization circuit; and
   a feedback circuit coupled between said second output of said directional coupler and said second input of said first power combiner and having a control input at which a control signal is applied for controlling the transfer function thereof, wherein said feedback circuit includes,
   (a) a power splitter having an input coupled to said second output of said directional coupler and having a plurality of outputs,
   (b) a second power combiner having a plurality of inputs respectively coupled to said plurality of outputs of said power splitter and having an output coupled to said second input of said first power combiner, and
   (c) a plurality of amplitude/phase control circuits respectively coupled between said plurality of outputs of said power splitter and said plurality of inputs of said second power combiner; and
   a signal monitor circuit having an input coupled to said first output of said directional coupler and having first and second outputs wherein said first output is coupled to the input of the second utilization circuit; and
   a control circuit coupled between a second output of said second directional coupler and said control input of said feedback circuit.

13. The tuning circuit of claim 12 wherein said control signal includes a plurality of control signals.

14. The tuning circuit of claim 13 wherein said plurality of amplitude/phase control circuits includes:
- a first amplitude control circuit coupled between a first one of said plurality of outputs of said power splitter and a first one of said plurality of inputs of said second power combiner and responsive to a first one of said plurality of control signals;
- a first phase shift circuit coupled between said first one of said plurality of outputs of said power splitter and said first one of said plurality of inputs of said second power combiner;
- a second amplitude control circuit coupled between a second one of said plurality of outputs of said power splitter and a second one of said plurality of inputs of said second power combiner and responsive to a second one of said plurality of control signals;
- a second phase shift circuit coupled between said second one of said plurality of outputs of said power splitter and said second one of said plurality of inputs of said second power combiner;
- a third amplitude control circuit coupled between a third one of said plurality of outputs of said power splitter and a third one of said plurality of inputs of said second power combiner and responsive to a third one of said plurality of control signals;
- a third phase shift circuit coupled between said third one of said plurality of outputs of said power splitter and said third one of said plurality of inputs of said second power combiner;
- a fourth amplitude control circuit coupled between a fourth one of said plurality of outputs of said power splitter and a fourth one of said plurality of inputs of said second power combiner and responsive to a fourth one of said plurality of control signals; and
- a fourth phase shift circuit coupled between said fourth one of said plurality of outputs of said power splitter and said fourth one of said plurality of inputs of said second power combiner.

15. A method of increasing the power transferred between first and second electrically coupled utilization circuits while controlling the reflection coefficient therebetween, comprising the steps of:
- separating the incident signal power and reflected signal power from the second utilization circuit;
- providing a controllable feedback signal responsive to the reflected signal and proportional to the power loss between said first and second utilization circuits; and
- combining said controllable feedback signal and the output signal of the first utilization circuit for compensating for the power loss between the first and second utilization circuits and increasing the power available to the second utilization circuit.

16. The method of claim 15 wherein said step of providing a controllable feedback signal includes the steps of:
- measuring the signal power applied at the input of the second utilization circuit;
- developing a control signal in response to the signal power applied at the second utilization circuit for controlling the magnitude and phase of said controllable feedback signal; and
- adjusting the magnitude and phase of said controllable feedback signal such that the power level thereof is proportional to the power loss between the first and second utilization circuits.

17. The method of claim 15 further comprising the steps of:
- amplifying said combination of the signal power of the input signal and said controllable feedback signal through a power amplifier; and
- blocking the reflected signal from the output of said power amplifier.

* * * * *